United States Patent
Cote et al.

(10) Patent No.: US 7,456,420 B2
(45) Date of Patent: Nov. 25, 2008

(54) ELECTRODE FOR PHASE CHANGE MEMORY DEVICE AND METHOD

(75) Inventors: Donna R. Cote, Poughquag, NY (US); Ronald W. Mauthe, Wappingers Falls, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 94 days.

(21) Appl. No.: 11/308,104

(22) Filed: Mar. 7, 2006

(65) Prior Publication Data
US 2007/0210296 A1    Sep. 13, 2007

(51) Int. Cl.
*H01L 47/00*    (2006.01)
(52) U.S. Cl. .................. 257/4; 257/E31.029; 438/95
(58) Field of Classification Search .................. None
See application file for complete search history.

(56) References Cited

U.S. PATENT DOCUMENTS

| | | | |
|---|---|---|---|
| 6,744,088 B1 | 6/2004 | Dennison | |
| 6,764,984 B2 | 7/2004 | Beatty | |
| 6,791,102 B2 | 9/2004 | Johnson et al. | |
| 6,797,979 B2 | 9/2004 | Chiang et al. | |
| 6,830,952 B2 | 12/2004 | Lung | |
| 7,259,040 B2* | 8/2007 | Pellizer et al. | 438/102 |
| 2003/0155655 A1* | 8/2003 | Fitzsimmons et al. | 257/774 |
| 2005/0029502 A1* | 2/2005 | Hudgens | 257/4 |
| 2006/0234502 A1* | 10/2006 | Bhat et al. | 438/656 |
| 2006/0278900 A1* | 12/2006 | Chang et al. | 257/248 |

OTHER PUBLICATIONS

Y.N. Hwang, et al., "Completely CMOS-Compatible Phase-Change Nonvolatile RAM Using NMOS Cell Transistors," Samsung Electronics Co., Ltd., pp. 91-92.
Dave Bursky, "Nonvolatile Memory: More Than A Flash In The Pan." ED Online ID #5267, Jul. 2003, pp. 1-3.

* cited by examiner

*Primary Examiner*—Evan Pert
*Assistant Examiner*—Ben P Sandvik
(74) *Attorney, Agent, or Firm*—Steven Capella; Hoffman Warnick LLC

(57) ABSTRACT

An electrode for a memory material of a phase change memory device is disclosed. The electrode includes a first layer adhered to the memory material, the first layer including a nitride ($AN_x$), where A is one of titanium (Ti) and tungsten (W) and x greater than zero, but is less than 1.0, and a second layer adhered to the first layer, the second layer including a nitride ($AN_y$), where y is greater than or equal to 1.0. The multiple layer electrode allows the first layer to better adhere to chalcogenide based memory material, such as GST, than for example, stoichiometric TiN or WN, which prevents delamination. A phase change memory device and method are also disclosed.

17 Claims, 4 Drawing Sheets

ELECTRODE FOR PHASE CHANGE MEMORY DEVICE AND METHOD

BACKGROUND OF THE INVENTION

1. Technical Field

The invention relates generally to phase change memory, and more particularly, to an electrode and method for a phase change material of a phase change memory device.

2. Background Art

Phase change memory (PCM) is a type of non-volatile computer memory using a phase change material capable of resistance changes depending on the mechanical phase of the material. PCM may also be known as ovonic unified memory (OUM), chalcogenide random access memory (CRAM) or phase-change random access memory (PRAM). Almost all PCMs are built using a chalcogenide alloy, typically a mixture of germanium (Ge), antimony (Sb) and tellurium (Te), which is referred to as GST. One GST alloy has the formula: $Ge_2Sb_2Te_5$. Under high temperature (over 600° C.), a chalcogenide becomes liquid and by subsequent rapid cooling it is frozen into an amorphous glass-like state and its electrical resistance is high. By heating the chalcogenide to a temperature above its crystallization point, but below the melting point, it will transform into a crystalline state with a much lower resistance. In addition, when the material is set to a particular state representing a resistance value, the value is retained until reset by another phase change of the material. The phase switching can be completed very quickly, e.g., under 10 ns. During use as a PCM, the phase of the phase change material is typically changed by heat created by a small pulse of electrical power.

As a result of the above properties, chalcogenide materials provide a promising mechanism for memories in next generation technology. In particular, the phase change materials can be easily integrated into conventional complementary metal-oxide semiconductor (CMOS) processing. PCMs also provide a number of advantages compared to conventional memories. For example, PCMs provide a significant space advantage over conventional static random access memory (SRAM) cell designs, do not need periodic refresh to retain information as with conventional dynamic random access memory (DRAM), and are more scalable than magnetic random access memory (MRAM).

A typical PCM cell includes a layer of chalcogenide material positioned between two electrically conducting electrodes. One challenge relative to PCMs, however, is providing adequate adhesion between the electrode material and the chalcogenide material. In many instances, the electrode material may include titanium nitride (TiN), which has a very poor adhesion to GST, resulting in delamination. Adhesion layers have also been employed such as disclosed in U.S. Pat. No. 6,744,088, which is hereby incorporated herein by reference.

There is a need in the art for a solution not available in the related art.

SUMMARY OF THE INVENTION

An electrode for a memory material of a phase change memory device is disclosed. The electrode includes a first layer adhered to the memory material, the first layer including a nitride ($AN_x$), where A is one of titanium (Ti) and tungsten (W) and x greater than zero, but is less than 1.0, and a second layer adhered to the first layer, the second layer including the nitride ($AN_y$), where y is greater than or equal to 1.0. The multiple layer electrode allows the first layer to better adhere to chalcogenide based memory material, such as GST, than for example, stoichiometric TiN or WN, which reduces delamination. A phase change memory device and method are also disclosed.

A first aspect of the invention provides an electrode for a memory material of a phase change memory device, the electrode comprising: a first layer adhered to an upper surface of the memory material, the first layer including a nitride ($AN_x$), where A is one of titanium (Ti) and tungsten (W) and x greater than zero, but is less than 1.0; and a second layer adhered to the first layer, the second layer including a nitride ($AN_y$), where y is greater than or equal to 1.0.

A second aspect of the invention provides a method of forming an electrode for a memory material of a phase change memory device, the method comprising the steps of: forming a first layer adhered to an upper surface of the memory material, the first layer including a nitride ($AN_x$), where A is one of titanium (Ti) and tungsten (W) and x greater than zero, but is less than 1.0; and forming a second layer adjacent to the first layer, the second layer including a nitride ($AN_y$), where y is greater than or equal to 1.0.

A third aspect of the invention provides a phase change memory (PCM) device, comprising: a memory cell including a chalcogenide material; and an electrode including: a first layer adhered to an upper surface of the chalcogenide material, the first layer including titanium nitride ($TiN_x$), where x greater than zero, but is less than 1.0, and a second layer adhered to the first layer, the second layer including titanium nitride ($TiN_y$), where y is greater than or equal to 1.0, wherein the first layer has a lower resistance than the second layer.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
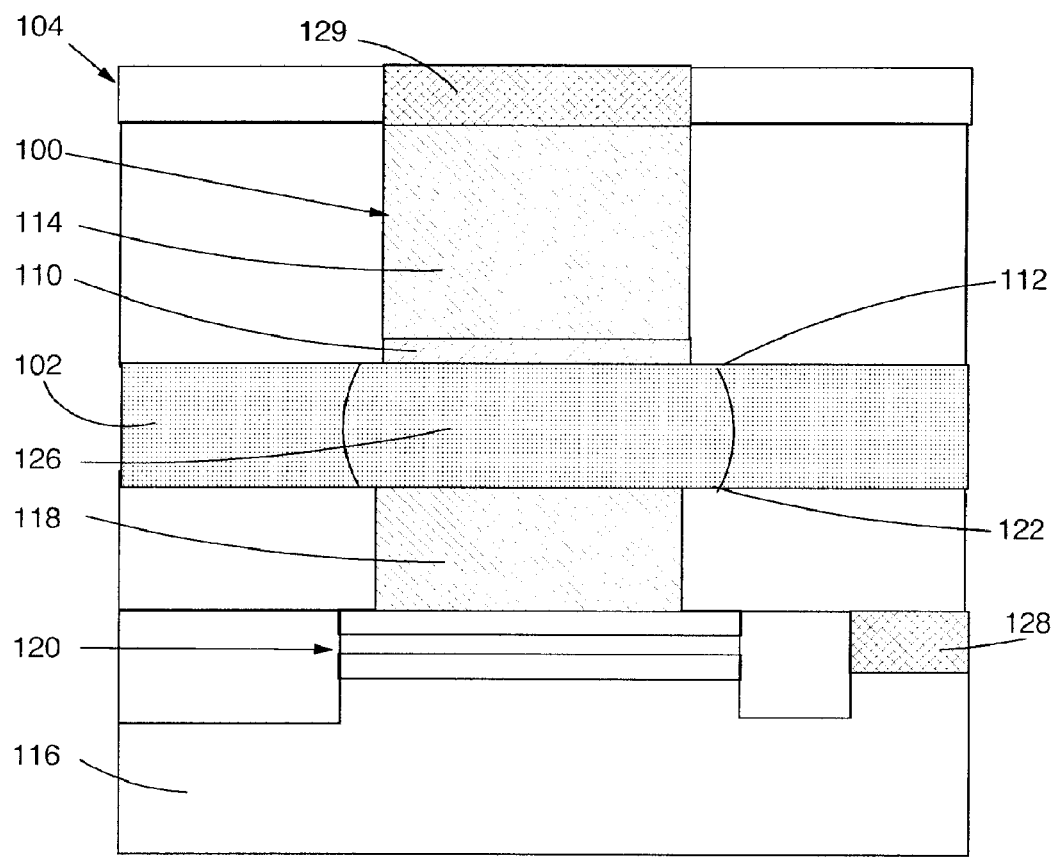
FIG. 1 shows an electrode for a memory material of a phase change memory according to one embodiment of the invention.

Turning to the drawings, FIG. 1 shows one embodiment of an electrode 100 for a memory material 102 of a phase change memory (PCM) device 104. Electrode 100 includes a first layer 110 adhered to a (upper) surface 112 of memory material 102 opposite a diode (lower) electrode 118 and a second layer 114 adhered to first layer 110. First layer 110 includes a nitride ($AN_x$), where A is titanium (Ti) or tungsten (W) and x greater than zero, but is less than 1.0, and second layer 114 includes a nitride ($AN_y$), where y is greater than or equal to 1.0. In one embodiment, memory material 102 includes a chalcogenide material, but other now known or later developed memory material may be implemented. In one embodiment, the chalcogenide material includes germanium (Ge), antimony (Sb) and tellurium (GST) (Ge$_2$Sb$_2$Te$_5$). First layer 110 may have a thickness of approximately 10-25 Angstrom (Å), and second layer 114 may have a thickness of approximately 100-2000 Å. In one embodiment, first layer 110 has a lower resistance than second layer 114.

PCM device 104 also may include substrate 116 including a diode (lower) electrode 118 therein for connecting a diode 120, e.g., a PNP diode, to a (lower) surface 122 of memory material 102. Diode electrode 118 and diode 120 may be formed in substrate 116 in any now known or later developed manner. PCM device 104 also includes a memory cell 126 including chalcogenide material (i.e., memory material 102) and electrode 100, as described above. A current source 128 (e.g., a metal wire) for applying a current to diode electrode 118 via diode 120 may also be provided as part of PCM device 104, and a current drain 129 (e.g., metal wire) may be provided coupled to electrode 100. It is understood that other structure may also be provided.

Figure 2:
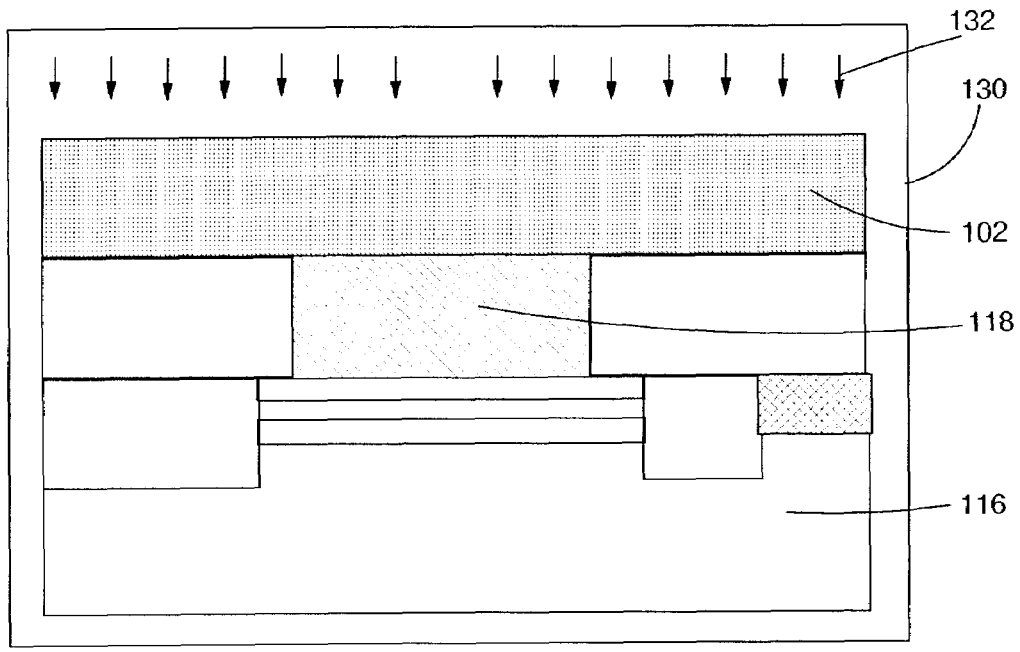
FIGS. 2-5 show a method of forming an electrode for a memory material of a phase change memory according to one embodiment of the invention.

Turning to FIGS. 2-5, one embodiment of a method of forming electrode 100 (FIG. 1) is illustrated. The method may occur in a single process chamber 130. As noted above, memory material 102 may include a chalcogenide material such as GST. As shown in FIG. 2, memory material 102 may be formed by sputter deposition 132 over substrate 116 and diode electrode 118, which have been previously formed.

Figure 3:
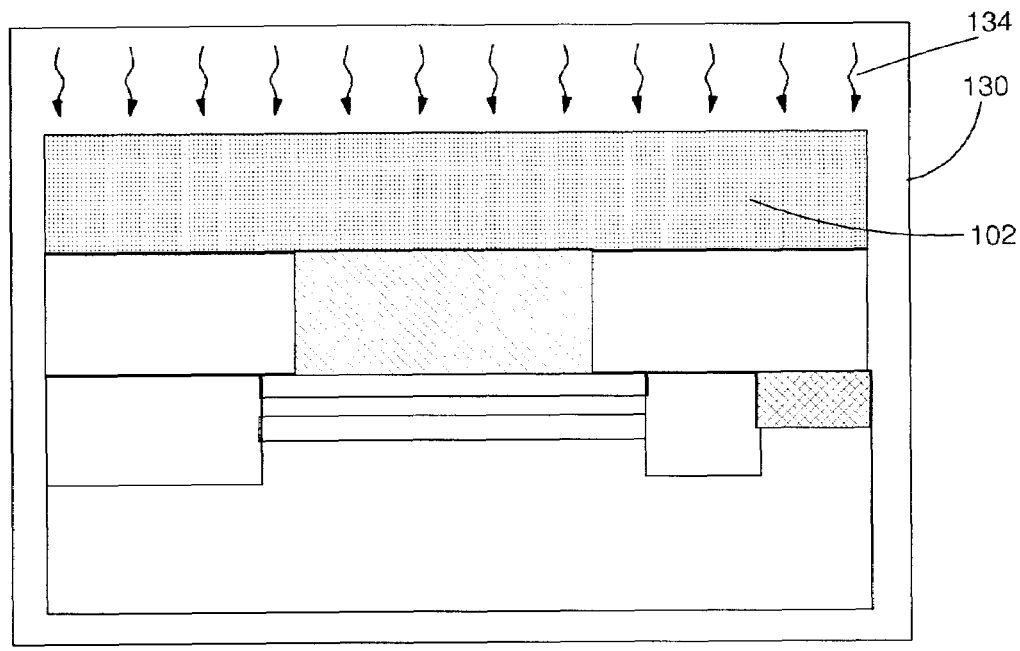

In a second step shown in FIG. 3, memory material 102 may be exposed to a low temperature (e.g., $\leq 100°$ C.) de-gas 134 via, for example, an electrical resistive heater. Use of a higher temperature de-gas, e.g., using an infra-red lamp, has been found disadvantageous because it may overheat or melt memory material 102.

Figure 4:
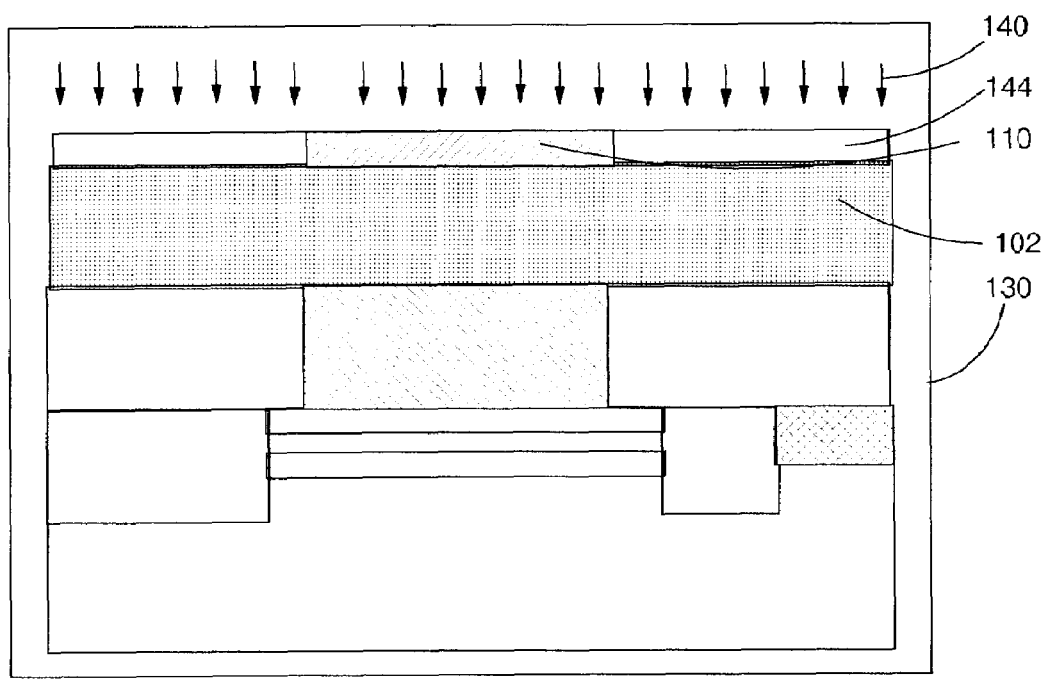

In a next step shown in FIG. 4, first layer 110 is formed over surface 112 (FIG. 1) of memory material 102. First layer 110 adheres to surface 112 of memory material 102. In one embodiment, first layer 110 formation may include performing an anneal (e.g., with a heated pedestal with backside gas or oven) in an inert gas such as argon (Ar) or helium (He), and a physical vapor deposition (PVD) 140 of the nitride. As a result, first layer 110 is formed including the nitride (AN$_x$) with a lower concentration of nitrogen (N$_2$), i.e., x greater than zero, but is less than 1.0. First layer 110 is shown within a dielectric layer 144. It is understood that first layer 110 may be formed first by, e.g., deposition of an entire layer followed by patterning and etching, and then formation of dielectric layer 144.

Figure 5:
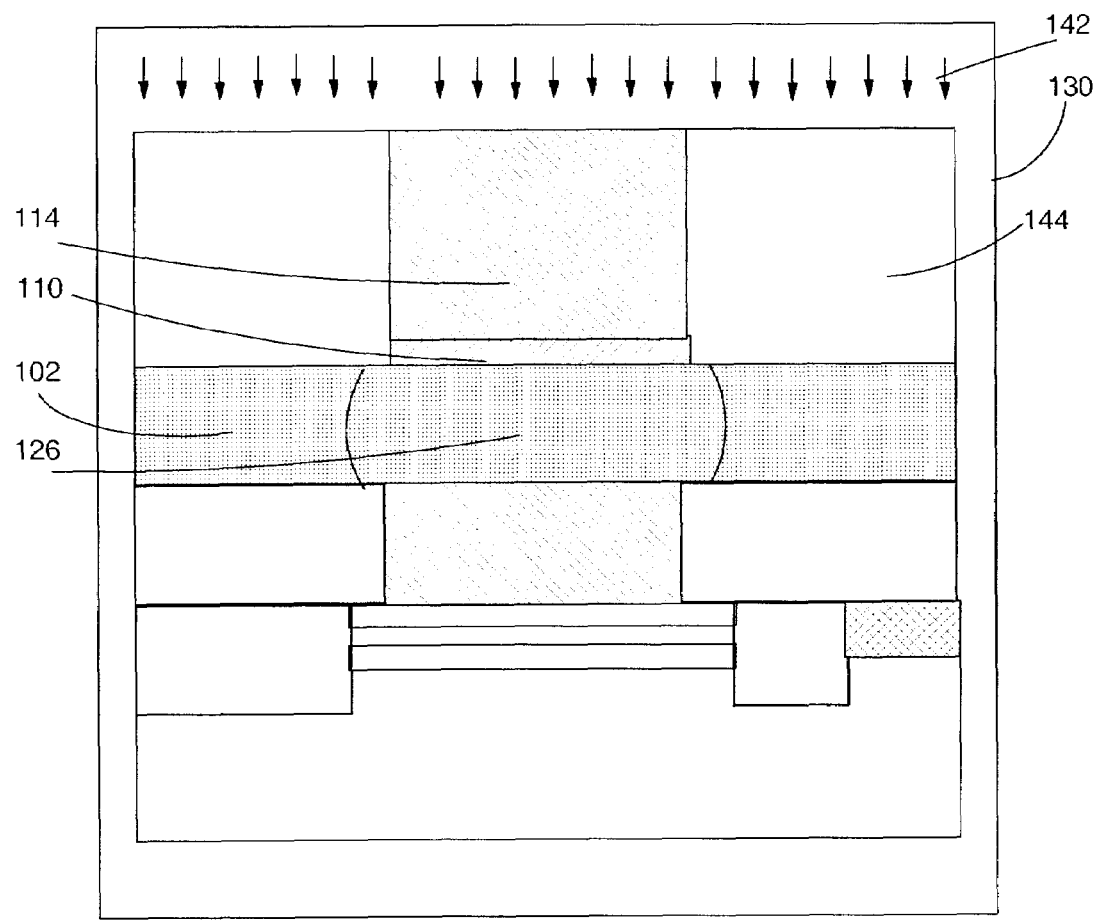

Next, as shown in FIG. 5, second layer 114 is formed adhered to first layer 110. As noted above, second layer 114 includes a nitride (AN$_y$), where y is greater than or equal to 1.0. As with first layer 110, in one embodiment, second layer 114 formation may include performing a slow anneal (e.g., with a heated pedestal with backside gas or oven) in an inert gas such as argon (Ar) or helium (He), and a physical vapor deposition (PVD) 142 of the nitride. Second layer 114 is formed in a more columnar crystal formation than first layer 110 such that it can withstand more stress. However, second layer 114 can not adhere to memory material 102 as well as first layer 110. In contrast, first layer 110 provides better adhesion to memory material 102 because of the lower nitrogen content. For example, an interface between first layer 102 and memory material 102, e.g., chalcogenide material, can withstand up to approximately 2500 mega-Pascal (MPa) of stress without separating. As with first layer 110, second layer 114 is shown within dielectric layer 144, some of which may be added after first layer 110 formation. It is understood, however, that second layer 114 may be formed first by deposition of an entire layer followed by patterning and etching, and then deposition of more of dielectric layer 144.

The foregoing description of various aspects of the invention has been presented for purposes of illustration and description. It is not intended to be exhaustive or to limit the invention to the precise form disclosed, and obviously, many modifications and variations are possible. For example, it is understood that some of the above-described method steps may be omitted. Such modifications and variations that may be apparent to a person skilled in the art are intended to be included within the scope of the invention as defined by the accompanying claims.

What is claimed is:

1. An electrode for a memory material of a phase change memory device, the electrode comprising:
   a first layer adhered to a surface of the memory material opposite a diode electrode, the first layer including a nitride (AN$_x$), where A is one of titanium (Ti) and tungsten (W) and x is less than 1.0, and wherein the first layer has a thickness of no less than approximately 10 Angstrom (Å) and no greater than approximately 25 Å; and
   a second layer adhered to the first layer, the second layer including a nitride (AN$_y$), where y is greater than or equal to 1.0, and the second layer has a thickness of no less than approximately 100 Angstrom (Å) and no greater than approximately 2000 Å.

2. The electrode of claim 1, wherein the memory material includes a chalcogenide material.

3. The electrode of claim 2, wherein the chalcogenide material includes: germanium (Ge), antimony (Sb) and tellurium (GST) (Ge$_2$Sb$_2$Te$_5$).

4. The electrode of claim 1, wherein the first layer has a lower resistance than the second layer.

5. A method of forming an electrode for a memory material of a phase change memory device, the method comprising the steps of:
   forming a first layer adhered to an upper surface of the memory material, the first layer including a nitride (AN$_x$), where A is one of titanium (Ti) and tungsten (W) and x is less than 1.0; and
   forming a second layer adjacent to the first layer, the second layer including the nitride (AN$_y$), where y is greater than or equal to 1.0,
   wherein the forming steps each include performing a physical vapor deposition and annealing in an inert gas selected from the group consisting of: argon (Ar) and helium (He).

6. The method of claim 5, wherein the memory material includes a chalcogenide material.

7. The method of claim 6, wherein the chalcogenide material includes: germanium (Ge), antimony (Sb) and tellurium (GST) (Ge$_2$Sb$_2$Te$_5$).

8. The method of claim 6, wherein the memory material is formed by a sputtered deposition.

9. The method of claim 6, further comprising the step of performing a low temperature de-gas of the memory material prior to the forming steps.

10. The method of claim 5, wherein both forming steps occur in a single process chamber.

11. The method of claim 5, wherein the first layer has a lower resistance than the second layer.

12. A phase change memory (PCM) device, comprising:
    a memory cell including a chalcogenide material; and
    an electrode including:
       a first layer adhered to a surface of the chalcogenide material opposite a diode electrode, the first layer including titanium nitride (TiN$_x$), where x is less than 1.0, and wherein the first layer has a thickness of no less than approximately 10 Angstrom (Å) and no greater than approximately 25 Å, and a second layer adhered to the first layer, the second layer including titanium nitride (TiN$_y$), where y is greater than or equal to 1.0, wherein the first layer has a lower resistance than the second layer.

13. The PCM device of claim 12, wherein the chalcogenide material includes: germanium (Ge), antimony (Sb) and tellurium (GST).

14. The PCM device of claim 12, wherein the second layer has a thickness of no less than approximately 100 Angstrom (Å) and no greater than approximately 2000 Å.

15. The PCM device of claim 12, further comprising a PNP diode in contact with the diode electrode that contacts to another surface of the chalcogenide material.

16. The PCM device of claim 15, further comprising a current source for applying a current to the PNP diode.

17. The PCM device of claim 12, wherein an interface between the first layer and the chalcogenide material can withstand up to approximately 2500 mega-Pascal (MPa) of stress without separating.

* * * * *